US006551760B2

(12) United States Patent
Uesugi et al.

(10) Patent No.: US 6,551,760 B2
(45) Date of Patent: Apr. 22, 2003

(54) LITHOGRAPHIC PRINTING PLATE, METHOD FOR PRODUCING LITHOGRAPHIC PRINTING PLATE, AND METHOD FOR PRODUCING SUPPORT FOR LITHOGRAPHIC PRINTING PLATE

(75) Inventors: Akio Uesugi, Kanagawa (JP); Masahiro Endo, Kanagawa (JP)

(73) Assignee: Fuji Photo Film Co., Ltd., Minami-ashigara (JP)

( * ) Notice: Subject to any disclaimer, the term of this patent is extended or adjusted under 35 U.S.C. 154(b) by 124 days.

(21) Appl. No.: 09/814,973

(22) Filed: Mar. 23, 2001

(65) Prior Publication Data

US 2001/0028990 A1 Oct. 11, 2001

Related U.S. Application Data

(62) Division of application No. 08/948,669, filed on Oct. 10, 1997, now Pat. No. 6,232,037.

(30) Foreign Application Priority Data

Oct. 11, 1996 (JP) ............................................ 8-270097
Dec. 25, 1996 (JP) ............................................ 8-345805

(51) Int. Cl.[7] ............................ B41N 1/08; G03F 7/07

(52) U.S. Cl. .................... 430/278.1; 430/162; 430/526; 205/206; 205/208; 205/214

(58) Field of Search ................................ 205/206, 208, 205/214; 430/278.1, 162, 526

(56) References Cited

U.S. PATENT DOCUMENTS

| | | | | | |
|---|---|---|---|---|---|
| 4,082,040 A | | 4/1978 | Yamashina et al. | | |
| 4,377,447 A | * | 3/1983 | Bednarz | ...................... | 204/15 |
| 4,427,500 A | | 1/1984 | Platzer | ........................ | 204/33 |
| 4,561,944 A | * | 12/1985 | Sasaki et al. | ................. | 204/33 |
| 4,581,996 A | | 4/1986 | Platzer | | |
| 4,909,894 A | * | 3/1990 | Uesugi et al. | .............. | 156/640 |
| 4,976,198 A | * | 12/1990 | Ohba et al. | ................. | 101/459 |
| 5,122,243 A | | 6/1992 | Hall | ...................... | 204/129.35 |
| 5,226,929 A | * | 7/1993 | Morii et al. | .................. | 51/298 |
| 5,405,730 A | * | 4/1995 | Coppens et al. | ............ | 430/204 |
| 5,550,002 A | * | 8/1996 | Kojima et al. | .............. | 430/258 |

FOREIGN PATENT DOCUMENTS

| | | |
|---|---|---|
| EP | 0573988 | 12/1963 |
| EP | 0317866 | 5/1989 |
| EP | 0778158 | 6/1997 |
| JP | 6-24166 | 2/1994 |
| JP | 6-92052 | 4/1994 |
| JP | 8-104069 | 4/1996 |
| WO | WO81/02547 | 9/1981 |
| WO | WO97/31783 | 9/1997 |

* cited by examiner

*Primary Examiner*—Cynthia Hamilton
(74) *Attorney, Agent, or Firm*—Burns, Doane, Swecker & Mathis, LLP

(57) ABSTRACT

A lithographic printing plate having an average curvature in a rolling direction of $1.5\times10^{-3}$ $mm^{-1}$ or less, a curvature distribution in a crosswise direction of $1.5\times10^{-3}$ $mm^{-1}$ or less, and a curvature in a direction perpendicular to said rolling direction of $1.0\times10^{-3}$ $mm^{-1}$ or less and a method for producing the printing plate are disclosed. A method for producing a support for a lithographic printing plate is also disclosed, which comprises roughening a surface of an aluminum web having a center line average surface roughness of 0.15 to 0.35 $\mu$m and a maximum surface roughness of 1 to 3.5 $\mu$m by at least one of mechanical surface roughening, chemical etching and electrochemical surface roughening, and then applying anodization thereto.

4 Claims, 2 Drawing Sheets

LITHOGRAPHIC PRINTING PLATE, METHOD FOR PRODUCING LITHOGRAPHIC PRINTING PLATE, AND METHOD FOR PRODUCING SUPPORT FOR LITHOGRAPHIC PRINTING PLATE

This application is a divisional of U.S. patent application Ser. No. 08/948,669, filed Oct. 10, 1997, U.S. Pat No. 6,232,037.

FIELD OF THE INVENTION

The present invention relates to a lithographic printing plate in which aluminum or an aluminum alloy is used as a support, and a method for producing the same. In particular, the present invention relates to a lithographic printing plate complying with automated accumulation, exposure and development procedures thereof, and a method for producing the same.

The present invention further relates to a method for producing a support for a lithographic printing plate, and particularly to a method for producing a support for a lithographic printing using aluminum or an aluminum alloy.

BACKGROUND OF THE INVENTION

In recent years, with the progress of automated platemaking in lithographic printing, lithographic-printing plates more excellent in flatness, as well as lithographic printing plates having better printing performance, have been required in order to make it possible to cut and accumulate them more stably and at higher speed, complying with automated platemaking and mass production.

The flatness is disclosed in JP-A-8-104069 (the term "JP-A" as used herein means an "unexamined published Japanese patent application"). The above-mentioned patent proposes a material specified in tensile strength and warping in a rolling direction in a coil-like raw plate of an aluminum alloy plate after final cold rolling, and describes that the coil-like aluminum raw plate having flatness so as not to induce exposure deviation of a lithographic plate can be supplied thereby even in an automatic conveying step of a lithographic photosensitive printer.

In the technique disclosed in the above-mentioned patent, the printer using the support for the lithographic printing plate is stably automated by specifying the characteristics of the raw material. However, particularly in recent years, it is necessary to improve the flatness of the lithographic printing plates for increased efficiency of exposure and development, as well as further improvement in printing performance of the lithographic printing plates, and also in terms of cost, further improvement in productivity of the lithographic printing plates has been earnestly desired. Accordingly, even the technique disclosed in the above-mentioned patent is not said to be sufficient yet.

On the other hand, aluminum and aluminum alloys are used as aluminum supports for printing plates, particularly supports for lithographic printing plates.

In general, in order to use aluminum plates as substrates for lithographic printing plates, it is necessary that they have appropriate adhesion to photosensitive agents and water receptivity, and that surfaces thereof are uniformly roughened. The uniformly roughened surfaces require that the size of pits formed is appropriately uniform and such pits are uniformly formed on the whole surfaces. The pits significantly influence the scumming reduction and the printing durability, the printing performances of plate materials, and good or bad thereof is an important factor in the production of the plate materials.

JP-A-6-92052 proposes an invention comprising the steps of mechanically roughening a surface, followed by etching within the range of 0.5 to 30 g/m$^2$, and performing pulse energizing of 200 to 600 c/dm$^2$. Further, JP-A-7-9776 proposes to conduct etching in 1 to 5 g/m$^2$ after mechanical surface roughening, and performing electrochemical surface roughening at an alternating current quantity of electricity of 300 to 800 c/dm$^2$. JP-A-6-24166 proposes an invention comprising the steps of mechanically roughening a surface, followed by etching within the range of 0.5 to 30 g/m$^2$, and conducting alternating current electrolysis at 200 to 600 c/dm$^2$. Methods for roughening surfaces of substrates include mechanical surface roughening, chemical etching and electrochemical surface roughening. In JP-A-6-24166, an invention is also disclosed in which various conditions of mechanical surface roughening, chemical etching and electrochemical surface roughening are changed. That is, it proposes that a surface is chemically etched in 0.5 to 30 g/m$^2$ after mechanical surface roughening, electrochemically roughened by giving an appropriate current density and quantity of electricity, then, etched within the range of 0.1 to 10 g/m$^2$ to smooth edges, and subjected to anodization.

In addition, U.S. Pat. Nos. 4,427,500 and 4,581,996 both corresponding to JP-B-3-42196 (the term "JP-B" as used herein means an "examined Japanese patent publication") specify the shape of a roughened surface obtained by preliminarily graining of a base material to a center line average roughness of up to 0.1 $\mu$m.

The above-mentioned inventions are excellent inventions. However, printing plates of higher quality have been desired from recent customers' needs, and the development of supports for lithographic printing plates fitting the needs have been desired. Further, it is necessary to decrease the production cost to a maximum.

In JP-A-6-92052 and JP-A-6-24166, no preliminary graining is conducted, so that the surface roughness after rolling is rough. When mechanical surface roughening, chemical etching and electrochemical surface roughening are applied to original aluminum having projecting streaks, photosensitive layers on projections become thin in sections of projecting streaks or in sections whose roughness is rough after coating, resulting in the development of disadvantages such as a reduction in printing durability and poor appearance at the sections. Further, JP-B-3-42196 discloses that the base material is preliminarily polished to a center line average roughness of up to-0.1 $\mu$m. However, in order to carry out this, much labor and cost are required, and the production cost is sometimes increased very high.

SUMMARY OF THE INVENTION

An object of the present invention is to provide lithographic printing plates having improved printing performance, increased efficiency of exposure and development procedures, improved flatness of the lithographic printing plates, and improved productivity of the lithographic printing plates.

Another object of the present invention is to provide a method for producing a support for a lithographic printing plate, which solves the above-mentioned problems, gives uniform quality and minimizes the production cost.

Intensive investigations and studies of the present inventors for solving the above-mentioned problems has resulted in completion of the present invention.

That is, the present invention provides (1) a lithographic printing plate having an average curvature in a rolling direction of $1.5\times10^{-3}$ $mm^{-1}$ or less, a curvature distribution in a crosswise direction of $1.5\times10^{-3}$ $mm^{-1}$ or less, and a curvature in a direction perpendicular to said rolling direction of $1.0\times10^{-3}$ $mm^{-1}$ or less.

The present invention further provides (2) a lithographic printing plate having an average surface roughness of 0.3 to 0.8 $\mu$m, a difference between an average surface roughness in a rolling direction and that in a direction perpendicular to the rolling direction of 30% or less of said average surface roughness, and further having an average curvature in a rolling direction of $1.5\times10^{-3}$ $mm^{-1}$ or less, a curvature distribution in a crosswise direction of $1.5\times10^{-3}$ $mm^{-1}$ or less, and a curvature in a direction perpendicular to said rolling direction of $1.0\times10^{-3}$ $mm^{-1}$ or less.

The present invention still further provides (3) a method for producing the lithographic printing plate described in (1) or (2) described above, which comprises performing a surface roughening treatment and an anodic oxide coating treatment on an aluminum plate, coating a photosensitive layer thereon, and then correcting said aluminum plate by use of correcting rolls having a diameter of 20 mm to 80 mm and a rubber hardness of 50 to 95 degrees.

The present invention further provides (4) a method for producing a support for a lithographic printing plate comprising roughening a surface of an aluminum base material having a center line average surface roughness of 0.15 to 0.35 $\mu$m and a maximum surface roughness of 1 to 3.5 $\mu$m by at least one of mechanical surface roughening, chemical etching and electrochemical surface roughening, and then applying anodization thereto.

It is preferred that the center line average surface roughness and the maximum surface roughness of said aluminum base material are given by preliminary graining, said preliminary graining being conducted by direct current electrolytic graining or by use of a roll formed of nonwoven fabric containing an abrasive with a mean grain size of 1 to 25 $\mu$m.

DETAILED DESCRIPTION OF THE INVENTION

Figure 1:
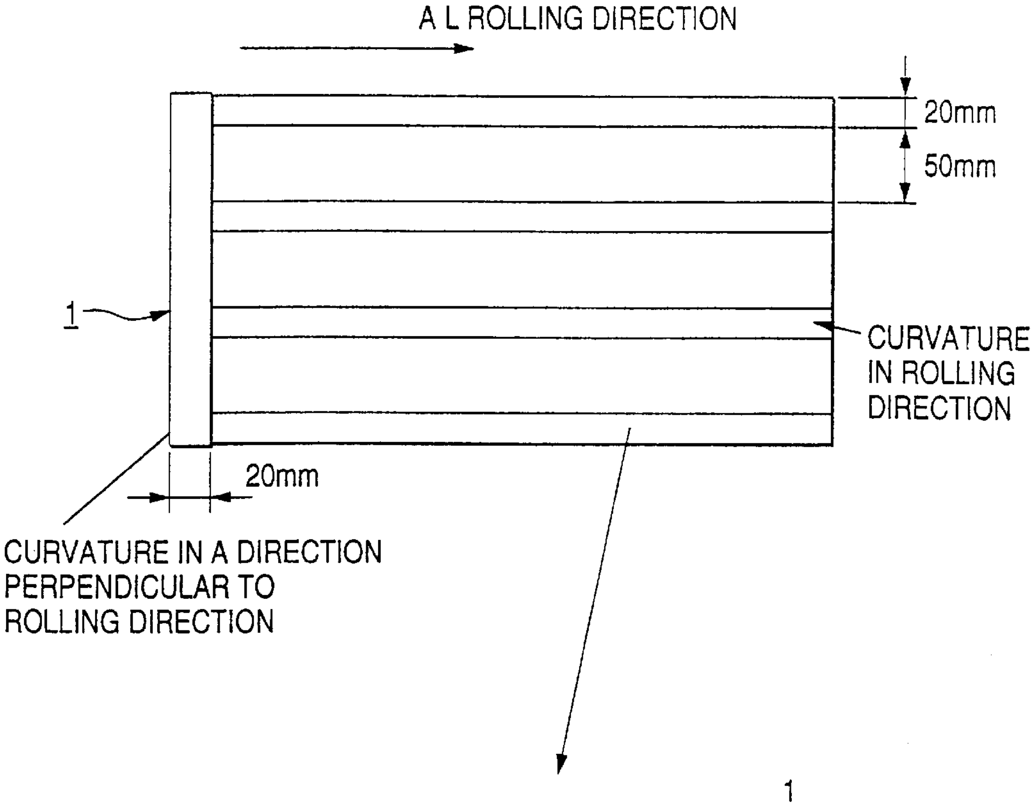
FIG. 1 shows schematic views for illustrating a method for measuring the flatness of a lithographic printing plate: (a) is a plan view of the lithographic printing plate, and (b) is a schematic view for illustrating the measuring method in the curved state.
Figure 1:
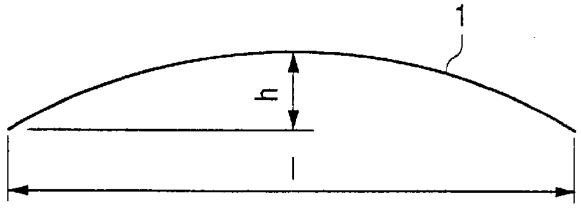

Pure aluminum and aluminum alloys are included in the aluminum plates used in the present invention. As the aluminum alloys, various alloys can be used. For example, alloys of silicon, copper, manganese, magnesium, chromium, zinc, lead, nickel, bismuth or the like and aluminum are used. Although various aluminum alloys are proposed, for example, Fe and Si components are limited to specify an intermetallic compound for an offset printing plate material in JP-B-58-6635. Further, in JP-B-55-28874, cold rolling and intermediate annealing are carried out, and a voltage applying method for roughening a surface by electrolysis is limited. Not only the aluminum alloys shown in JP-B-62-41304, JP-B-1-46577, JP-B-1-46578, JP-B-1-47545, JP-B-1-35910, JP-B-63-60823, JP-B-63-60824, JP-B-4-13417, JP-B-4-19290, JP-B-4-19291, JP-B-4-19293, JP-B-62-50540, JP-A-61-272357, JP-A-62-74060, JP-A-61-201747, JP-A-63-143234, JP-A-63 -143235, JP-A-63-255338, JP-A-1-283350, EP-272528, U.S. Pat. Nos. 4,902,353 and 4,818,300, EP-394816, U.S. Pat. No. 5,019,188, West German Patent 3,232,810, U.S. Pat. No. 4,435,230, EP-239995, U.S. Pat. No. 4,822,715, West German Patent 3,507,402, U.S. Pat. No. 4,715,903, EP-289844, U.S. Pat. Nos. 5,009,722 and 4,945,004, West German Patent 3,714,059, U.S. Pat. Nos. 4,686,083 and 4,861,396 and EP-158941, but also all general alloys are included. As methods for producing the plate materials, patents have recently been filed for methods using continuous casting, as well as for methods using hot rolling. For example, a plate material produced by a twin roll system is introduced in East German Patent 252,799. EP-223737 and U.S. Pat. Nos. 4,802,935 and 4,800,950 have been filed in the form in which trace alloy components are limited. EP-415238 proposes continuous casting and continuous casting +hot rolling.

In the present invention, various surface treatments and transfer are performed on such aluminum plates, thereby being able to obtain printing plates having uniform unevenness, and photosensitive layers such as diazo compounds are formed thereon, thereby being able to obtain excellent photosensitive lithographic printing plates. In all cases, it is necessary to select suitable materials.

According to circumstances, degreasing may first be performed. When degreasing is performed, methods are widely used in which solvents such as trichloroethylene and surfactants, or alkali etching agents such as sodium hydroxide and potassium hydroxide are used. JP-A-2-026793 discloses degreasing treatments. For example, solvent degreasing methods include methods using petroleum solvents such as gasoline, kerosene, benzene, solvent naphtha and normal hexane, and methods using chlorine solvents such as trichloroethylene, methylene chloride, perchloroethylene and 1,1,1-trichioroethane. Alkali degreasing methods include methods using aqueous solutions of sodium salts such as sodium hydroxide, sodium carbonate, sodium bicarbonate and sodium sulfate, methods using aqueous solutions of silicates such as sodium orthosilicate, sodium metasilicate, sodium disilicate and sodium trisilicate, and methods using aqueous solutions of phosphates such as sodium primary phosphate, sodium tertiary phosphate, sodium secondary phosphate, sodium tripolyphosphate, sodium pyrophosphate and sodium hexametaphosphate. When the alkali degreasing methods are used, surfaces of the aluminum plates may be possibly dissolved depending on the treating time and the treating temperature. Accordingly, the degreasing treatments are required to be conducted so as not to be accompanied by the dissolution phenomenon. In the degreasing treatments using surfactants, aqueous solutions of anionic surfactants, cationic surfactants, nonionic surfactants and amphoteric surfactants are used, and various commercial products can be used. As the degreasing methods, dipping methods, spraying methods and methods of rubbing with cloths impregnated with liquids can be used. Further, ultrasonic waves may be used in the dipping methods and the spraying methods. temperature. Accordingly, the degreasing treatments are required to be conducted so as not to be accompanied by the dissolution phenomenon. In the degreasing treatments using surfactants, aqueous solutions of anionic surfactants, cationic surfactants, nonionic surfactants and amphoteric surfactants are used, and various commercial products can be used. As the degreasing methods, dipping methods, spraying methods and methods of rubbing with cloths impregnated with liquids can be used. Further, ultrasonic waves may be used in the dipping methods and the spraying methods.

When the preliminary graining is electrochemically conducted, it is conducted in a sulfuric acid solution by direct current electrolysis. In this case, it is suitable that the sulfuric acid concentration is 15 to 80%, the temperature is 40 to 80° C., direct current is used as an electric source, the current density is 5 A/dm$^2$ to 50 A/dm$^2$, and the quantity of electricity is 100 to 3000 c/dm$^2$. When mechanically conducted, it is preferably conducted by use of a roll formed of nonwoven fabric constituted by polyamide, polyester or rayon fiber, said fabric containing an abrasive with a mean grain size of 1 to 25 $\mu$m. As the conditions of the preliminary graining, it is necessary to select conditions under which the surface roughness can be maintained to some extent. The diameter of the roll is 200 to 1000 mm. For keeping uniform surface quality, it is preferred that the vibration of 5 to 2000 cycles/minutes is given in a rolling direction of an original plate and a direction perpendicular thereto, and in a direction perpendicular to a line direction in the case of continuous treatment. Anyway, it is important to adjust the center line surface roughness to 0.15 to 0.35 $\mu$m and the maximum surface roughness to 1 to 3.5 $\mu$m by the preliminary graining. That is, it is important to adjust the center line average surface roughness and the maximum surface roughness to desired roughness, not limited to the above-mentioned direct current electrolysis and preliminary graining with the roll.

The mechanical surface roughening methods include transfer, brushes and liquid honing, and it is important to select them, considering the productivity and the like.

As the transfer methods of bringing uneven surfaces into contact with the aluminum plates, various methods can be used. That is, in addition to the methods shown in JP-A-55-74898, JP-A-60-36195 and JP-A-60-203496 described above, a method described in JP-A-6-55871 in which transfer is repeated several times and a method described in JP-A-6-24168 in which a surface of a backup roller in transferring process is elastic are also applicable.

Further, transfer may be repeated by use of a roll on which fine unevenness is etched by electric discharge machining, shot blasting, laser beam machining and plasma etching, or an unevenness pattern corresponding to an average size of fine grains may be transferred to an aluminum plate repeatedly plural times by bringing an uneven surface coated with the fine grains into contact with the aluminum plate and applying pressure thereto repeatedly.

Methods for imparting fine unevenness to the transfer roll are known in JP-A-3-086.35, JP-A-3-066404 and JP-A-63-065017. Further, fine grooves may be cut on a surface of the roll from two directions by use of a die, a cutting tool or a laser to form square unevenness on the surface. This roll surface may be treated so as to round the formed square unevenness by the known etching treatment. Needless to say, hardening or hard chrome plating may be carried out in order to increase the hardness of the surface.

Further, the surface roughening with brushes includes surface roughening with a wire brush, as well as surface roughening with a nylon brush. Furthermore, the surface roughening with high pressure water is shown in JP-A-59-21469, JP-A-60-19595 and JP-A-60-18390.

After such mechanical surface roughening, the aluminum surfaces are chemically treated with acids or alkalis for smoothing and homogenizing the aluminum plate as so required. In particular, when electrochemical surface roughening is performed as such successively after transfer, the surface roughening becomes non-uniform. Specific examples of the acids and the alkalis used in such chemical treatments include aqueous solutions of phosphoric acid, sulfuric acid, hydrochloric acid, nitric acid, sodium salts such as sodium hydroxide, sodium carbonate, sodium bicarbonate and sodium sulfate, aqueous solutions of silicates such as sodium orthosilicate, sodium metasilicate, sodium disilicate and sodium trisilicate, and aqueous solutions of phosphates such as sodium primary phosphate, sodium tertiary phosphate, sodium secondary phosphate, sodium tripolyphosphate, sodium pyrophosphate and sodium hexametaphosphate. As to the treating conditions, the concentration, the temperature and the time are suitably selected from 0.01% to 50% by weight, 20° C. to 90° C. and 5 seconds to 5 minutes, respectively. The etching amount is suitably selected depending on the characteristics of aluminum and the desired quality. JP-A-54-65607 and JP-A-55-125 299 propose pretreatment of the electrochemical surface roughening. Various kinds of pretreatments are included in JP-A-63-235500, JP-A-63-307990, JP-A-1-127388, JP-A-1-160690, JP-A-1-136789, JP-A-1-136788, JP-A-1-178497, JP-A-1-308689, JP-A-3-126871, JP-A-3-126900 and JP-A-3-173800, but the present invention is not limited thereto. However, when the aluminum surfaces are thus chemically treated with the aqueous solutions of acids or alkalis, insoluble residual portions, namely smuts, are produced on the surfaces. The smuts can be removed with phosphoric acid, nitric acid, sulfuric acid, chromic acid or mixtures thereof. In the present invention, the aluminum surfaces on which the electrochemical surface roughening treatment is performed are preferably clear surfaces having no smuts. However, when electrolytes are acids and have the desmutting function, it can be omitted.

The electrochemical surface roughening is performed on the aluminum plates thus treated, and smuts are removed with the same components as those of an electrolyte during electrolytic surface roughening. The electrochemical surface roughening is described in JP-B-48-28123 and British Patent 896,563. Previously, the above-mentioned electrolytic graining has been conducted using sinusoidal alternating electric current. However, it may be conducted using special waveform one as described in JP-A-52-58602. Further, methods are also applicable which are described in JP-A-55-158298, JP-A-56-28898, JP-A-52-58602, JP-A-52-152302, JP-A-54-85802, JP-A-60-190392, JP-A-58-120531, JP-A-63-176187, JP-A-1-5889, JP-A-1-280590, JP-A-1-118489, JP-A-1-148592, JP-A-1-178496, JP-A-1-188315, JP-A-1-154797, JP-A-2-235794, JP-A-3-260100, JP-A-3-253600, JP-A-4-72079, JP-A-4-72098, JP-A-3-267400 and JP-A-1-141094.

As the frequency, in addition to the above, the frequency proposed in electrolytic capacitors, for example, described in U.S. Pat. Nos. 4,276,129 and 4,676,879, can also be used.

As the electrolytes, in addition to nitric acid and hydrochloric acid described above, electrolytes can also be used which are described in U.S. Pat. Nos. 4,671,859; 4,666,576; 4,661,219; 4,618,405; 4,626,328; 4,600,482; 4,566,960; 4,566,958; 4,566,959; 4,416,972; 4,374,710; 4,336,113 and 4,184,932. As to electrolytic baths and electric sources, various ones are proposed in U.S. Pat. No. 4,203,637, JP-A-56-123400, JP-A-57-59770, JP-A-53-12738, JP-A-53-32821, JP-A-53-32822, JP-A-53-32823, JP-A-55-122896, JP-A-55-132884, JP-A-62-127550, JP-A-1-52100, JP-A-1-52098, JP-A-60-67700, JP-A-1-230800 and JP-A-3-257199. In addition to the above-mentioned patents, various ones are proposed. For example, ones are of course applicable which are described in JP-A-52-58602, JP-A-52-152302, JP-A-53-12738, JP-A-53-12739, JP-A-53-32821, JP-A-53-32822, JP-A-53-32833, JP-A-53-32824, JP-A-53-32825, JP-A-54-85802, JP-A-55-122896, JP-A-55-132884, JP-B-48-28123, JP-B-51-7081, JP-A-52-133838, JP-A-52-133840, JP-A-52-133844, JP-A-52-133845, JP-A-53-149135 and JP-A-54-146234.

The smuts are removed with a solution having the same components as those of the electrolyte, as described above. If the smuts are removed with a solution having components different from those of the electrolyte, a washing step becomes necessary after the smut removal step. This not only becomes a factor of an increase in cost, but also influences the electrolytic graining properties. The same components further make it possible to control the temperature and concentration in the electrolytic surface roughening procedure, even if the temperature and concentration are changed. As the smut removal methods, there are methods in which the smuts are chemically dissolved. However, the smuts may be forcedly removed by allowing a liquid to be collided with a web at high speed with a spray. Anyway, they may be selected totally considering the productivity, the equipment costs, the shape of cells for electrolytic surface roughening, and the like. In any methods, it is important to remove 5% to 70% of the smut amount. The amount of the smuts developed by the electrolytic surface roughening varies within the range of about 0.2 $g/m^2$ to about 5 $g/m^2$ according to electrolytic conditions. Accordingly, the amount of the smuts to be removed may be changed within this range depending on desired quality and performance.

The aluminum plates thus obtained are treated with alkalis or acids as so required. The alkali treatment is performed as described in JP-A-56-51388, and the desmut treatment is conducted with sulfuric acid as described in JP-A-53-12739. Further, the aluminum plates can be treated with phosphoric acid as described in JP-A-53-115302, and methods can also be used which are described in JP-A-60-8091, JP-A-63-176188, JP-A-1-38291, JP-A-1-127389, JP-A-1-188699, JP-A-3-177600, JP-A-3-126891 and JP-A-3-191100.

On a surface of the aluminum support thus obtained is preferably formed an anodic oxide coating. When current is passed through an aqueous solution or a non-aqueous solution of sulfuric acid, phosphoric acid, chromic acid, oxalic acid, sulfamic acid, benzenesufonic acid or a combination of two or more of them, as an electrolyte, using aluminum as an anode, the anodic oxide coating can be formed on the aluminum surface. No sweeping statement can be made for the treating conditions of anodization because they variously change depending on the electrolyte used. Generally speaking, however, it is suitable that the concentration of the electrolyte is 1 to 80% by weight, the temperature thereof is 5 to 70° C., the current density is 0.5 to 60 $A/cm^2$, the voltage is 1 to 100 V, and the electrolytic time is 15 seconds to 50 minutes. Electrolytic devices are introduced in JP-A-48-26638, JP-A-47-18739 and JP-B-58-24517. Of course, methods can also be used which are described in JP-A-54-81133, JP-A-57-47894, JP-A-57-51289, JP-A-57-51290, JP-A-57-54300, JP-A-57-136596, JP-A-58-107498, JP-A-60-200256, JP-A-62-136596, JP-A-63-176494, JP-A-4-176897, JP-A-4-280997, JP-A-6-207299, JP-A-5-32083, JP-A-5-125597 and JP-A-5-195291. As the electrolytes, electrolytes can also be used, of course, which are described in JP-A-3-253596, JP-A-62-82089, JP-A-1-133794, JP-A-54-32424 and JP-A-5-42783.

After the formation of the anodic oxide coating as described above, the anodic oxide coating is etched for optimizing the adhesion of each support and a photosensitive composition. Then, the sealing treatment may be conducted with water vapor and hot water to give a photosensitive printing plate good in aging stability and development properties and free from scumming in non-image sections. An apparatus for conducting such a sealing treatment is proposed in JP-B-56-12518, and the treatment may be conducted with such an apparatus after the coating formation. Further, the sealing treatment may be performed by use of apparatuses and methods described in JP-A-4-4194, JP-A-5-202496 and JP-A-5-179482.

In addition, the potassium fluorozirconate treatment described in U.S. Pat. No. 2,946,638, the phosphomolybdate treatment described in U.S. Pat. No. 3,201,247, the alkyl titanate treatment described in British Patent 1,108,559, the polyacrylic acid treatment described in German Patent 1,091,433, the polyvinylphosphonic acid treatment described in German Patent 1,134,093 and British Patent 1,230,447, the phosphonic acid treatment described in JP-B-44-6409, the phytic acid treatment described in U.S. Pat. No. 3,307,951, the treatment with salts of lipophilic organic polymer compounds and divalent metals described in JP-A-58-16893 and JP-A-58-18291, the formation of undercoat layers of hydrophilic cellulose (for example, carboxymethyl cellulose) containing water-soluble metal salts (for example, zinc acetate) described in U.S. Pat. No. 3,860,426, the hydrophilization treatment by the undercoating of water-soluble polymers having sulfonic acid groups described in JP-A-59-101651, the undercoating of phosphates described in JP-A-62-019494, water-soluble epoxy compounds described in JP-A-62-033692, phosphoric acid-modified starch described in JP-A-62-097892, diamine compounds described in JP-A-63-056498, inorganic or organic acids of amino acids described in JP-A-63-130391, organic phosphonic acids containing carboxyl or hydroxyl groups described in JP-A-63-145092, compounds containing amino groups and phosphonic acid groups described in JP-A-63165183, specific carboxylic acid derivatives described in JP-A-2-316290, phosphates described in JP-A-1-272594, compounds each having one amino group and one phosphoric oxygen acid group described in JP-A-3-261592, phosphates described in JP-A-3-215095, aliphatic or aromatic phosphonic acids such as phenylphosphonic acid described in JP-A-5-246171, S atom-containing compounds such as thiosalicylic acid described in JP-A-1-307745 and compounds having phosphoric oxygen acid groups described in JP-A-4-282637, and coloring with acid dyes described in JP-A-60-64352 can also be carried out. The center line average surface roughness (Ra) is shown in JIS-B0601-1970, and for the maximum surface roughness (Rmax), when a portion sampled from a cross sectional curve as long as a standard length is placed between two straight lines parallel to an average line thereof, the space between these straight lines is measured in a longitudinal ratio direction of the cross sectional curve, and this value is represented by $\mu$m (micrometer). More specifically, $R_a$ means the value obtained by the following formula and expressed in micrometer ($\mu$m) when sampling only the reference length from the roughness curve in the direction of mean line, taking X-axis in the direction of mean line and Y-axis in the direction of longitudinal magnification of this sampled part and the roughness curve is expressed by y=f(x):

$$R_a = \frac{1}{l}\int_0^l |f(x)|\,dx$$

where, 1:reference length

Figure 2:
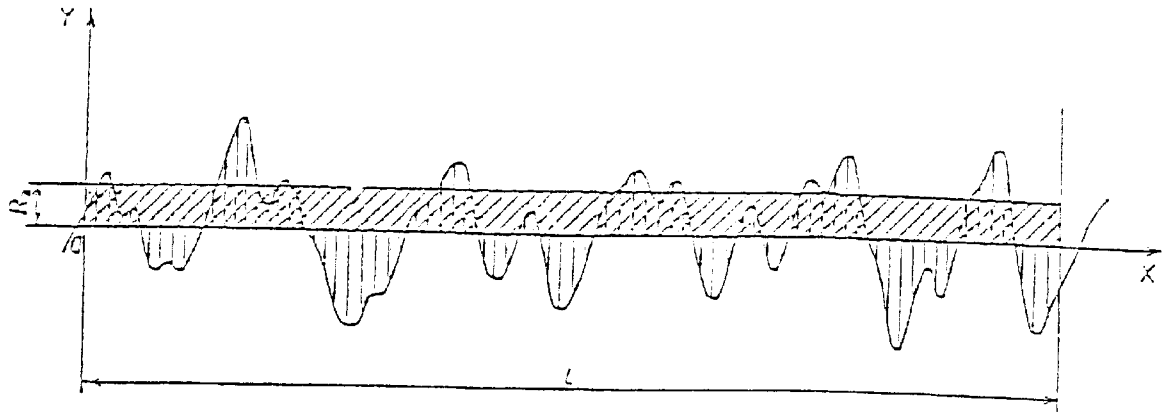
FIG. 2 illustrates the determination of $R_a$.

The determination of $R_a$ is graphically illustrated in FIG. 2.

Photosensitive layers given below are provided on the support of the present invention to obtain photosensitive lithographic printing plates.

[I] Formation of Photosensitive Layer Containing o-Naphthoquinonediazidosulfonic Ester and Novolak Resin Prepared from Phenol/Cresol Mixture o-Quinonediazido compounds mean o-naphthoquinonediazido compounds, which are described, for example, in U.S. Pat. Nos. 2,766,118, 2,767,092, 2,772,972, 2,859,112, 3,102,809, 3,106,465, 3,635,709, and 3,647,443, and a number of other publications. They can be appropriately employed for this purpose. Of these compounds, o-naphthoquinonediazidosulfonic esters and o-naphthoquinonediazidocarboxylic esters of aromatic hydroxy compounds, and o-naphthoquinonediazido-sulfonamides and o-naphthoquinonediazidocarboxylic acid amides of aromatic amino compounds are particularly preferred. Very superior examples of the compounds include esterification products of pyrogallol/acetone condensation products with o-naphthoquinonediazidosulfonic esters as described in U.S. Pat. No. 3,635,709, esterification products of polyesters containing terminal hydroxyl groups with o-naphthoquinonediazidosulfonic acids or o-naphthoquinonediazidocarboxylic acids as described in U.S. Pat. No. 4,028,111, esterification products of p-hydroxystyrene homopolymer or p-hydroxystyrene/other monomer copolymers with o-naphthoquinonediazidosulfonic acids or o-naphthoquinonediazidocarboxylic acids as described in British Patent 1,494,043, and amidation products of p-aminostyrene/other monomer copolymers with o-naphthoquinonediazidosulfonic acids or o-naphthoquinonediazidocarboxylic acids as described in U.S. Pat. No. 3,759,711.

Although these o-quinonediazido compounds can be singly employed, it is preferred to use mixtures thereof with alkali-soluble resins. Appropriate alkali-soluble resins are novolak type phenol resins, examples of which include phenol/formaldehyde resins, o-cresol/formaldehyde resins, and m-cresol/formaldehyde resins. Simultaneous use of the above-mentioned phenol resins and condensation products of phenol or cresol substituted by an alkyl group having 3 to 8 carbon atoms with formaldehyde such as a t-butylphenol/formaldehyde resin as described in U.S. Pat. No. 4,028,111 is more recommended.

To form visible images by exposure, compounds such as o-naphthoquinonediazido-4-sulfonyl chloride, inorganic anionic salts of p-diazodiphenylamine, trihalomethyloxadiazole compounds, and trihalomethyloxadiazole compounds containing a benzofuran ring are added to the photosensitive layer. On the other hand, triphenylmethane dyes such as Victoria Blue BOH, Crystal Violet, and Oil Blue are used as coloring materials of images. Dyes described in JP-A-62-293247 are particularly preferred.

Ink-receptivity enhancing agents can be incorporated into the photosensitive layer, which include novolak resins prepared by a condensation reaction of a phenol substituted by an alkyl group having 3 to 15 carbon atoms such as t-butylphenol or n-octylphenol with formaldehyde as described in JP-B-57-23253, and o-naphthoquinonediazido-4- or -5-sulfonic esters of such novolak resins as described, for example, in JP-A-61-242446).

To improve development properties, nonionic surfactants as described in JP-A-62-251740 can further be added to the photosensitive layer.

A composition comprising the above-mentioned components is dissolved in a solvent which can dissolve all the components, and then applied to a support. Examples of the solvents used for this purpose include ethylene dichloride, cyclohexanone, methyl ethyl ketone, ethylene glycol monomethyl ether, ethylene glycol monoethyl ether, 2-methoxyethyl acetate, 1-methoxy-2-propanol, 1-methoxy-2-propyl acetate, methyl lactate, ethyl lactate, dimethyl sulfoxide, dimethylacetamide, dimethylformamide, water, N-methylpyrrolidone, tetrahydrofurfuryl alcohol, acetone, diacetone alcohol, methanol, ethanol, isopropyl alcohol, and diethylene glycol dimethyl ether. These solvents can be used, singly or in combination.

A photosensitive composition comprising these components is applied to the support so as to be 0.5 to 3.0 g/$m^2$ in solid content.

[II] Formation of Photosensitive Layer Containing Diazo Resin and Water-Insoluble, Lipophilic Polymer Examples of diazo resins used herein include organic solvent-soluble inorganic salts of diazo resins which are prepared by reacting condensation products for example, between p-diazodiphenylamine and formaldehyde or acetaldehyde with hexafluorophosphoric acid salts or tetrafluoroboric acid salts; and organic solvent-soluble organic acid salts of diazo resins which are prepared by a reaction of the above-mentioned condensation products with sulfonic acids (for example, p-toluenesulfonic acid) or their salts, phosphinic acids (for example, benzenephosphinic acid) or their salts, or compounds containing a hydroxyl group (for example, 2,4-dihydroxybenzophenone and 2-hydroxy-4-methoxybenzophenone-5-sulfonic acid) or their salts as described in U.S. Pat. No. 3,300,309.

Other diazo resins used suitably in'the present invention are copolycondensation products containing the following two structural units in molecules; aromatic compounds having at least one organic group selected from a carboxyl group, a sulfonic acid group, a sulfinic acid group, a phosphorus oxygen acid group, and a hydroxyl group, and diazonium compounds, preferably an aromatic diazonium compounds. The above-mentioned aromatic compounds preferably refer to a phenyl group or a naphthyl group.

Various compounds can be enumerated as the aromatic compounds having at least one organic group selected from a carboxyl group, a sulfonic acid group, a sulfinic acid group, a phosphorus oxygen acid group, and a hydroxyl group. Preferred examples of the aromatic compounds include 4-methoxybenzoic acid, 3-chlorobenzoic acid, 2,4-dimethoxybenzoic acid, p-phenoxybenzoic acid, 4-anilinobenzoic acid, phenoxyacetic acid, phenylacetic acid, p-hydroxybenzoic acid, 2,4-dihydroxybenzoic acid, benzenesulfonic acid, p-toluenesulfinic acid, 1-naphthalenesulfonic acid, phenylphosphoric acid, and phenylphosphonic acid. Although the aromatic diazonium compounds which are one of the structural units of the above-mentioned copolycondensation products include diazonium salts as described, for example, in JP-B-49-48001, diphenylamine-4-diazonium salts are particularly preferred.

The diphenylamine-4-diazonium salts are derived from 4-aminodiphenylamines. Examples of such 4-aminodiphenylamines include 4-aminodiphenylamine, 4-amino-3-methoxydiphenylamine, 4-amino-2-methoxydiphenylamine, 4'-amino-2-methoxydiphenylamine, 4'-amino-4-methoxydiphenylamine, 4-amino-3-methyl-diphenylamine, 4-amino-3-ethoxydiphenylamine, 4-amino-3-β-hydroxyethoxydiphenylamine, 4-aminodiphenylamine-2-sulfonic acid, and 4-aminodiphenylamine-2-carboxylic acid. Of these compounds, 4-amino-3-methoxydiphenylamine and 4-amino-diphenylamine are particularly recommended.

In addition to the copolycondensation products of the diazo resins with the aromatic compounds having at least one acid group, diazo resins condensed with aldehydes or their acetals having an acid group as described in JP-A-4-18559, JP-A-3-163551, and JP-A-3-253857 can also be employed.

Counter anions of the diazo resins include anions which can stably form salts with the diazo resins and make the diazo resins soluble in organic solvents. These anions involve organic carboxylic acids such as decanoic acid and benzoic acid, organic phosphoric acids such as phenyl phosphoric acid, and sulfonic acids. Typical examples of the anions include aliphatic and aromatic sulfonic acids such as methanesulfonic acid, fluoroalkanesulfonic acids (for example, trifluoromethanesulfonic acid), laurylsulfonic acid, dioctyl sulfosuccinate, dicyclohexyl sulfosuccinate, camphorsulfonic acid, tolyloxy-3-propanesulfonic acid, nonylphenoxy-2-propanesulfonic acid, nonylphenoxy-4-butanesulfonic acid, dibutylphenoxy-3-propanesulfonic acid, diamylphenoxy-3-propanesulfonic acid, dinonylphenoxy-3-propanesulfonic acid, dibutylphenoxy-4-butanesulfonic acid, dinonylphenoxy-4-butanesulfonic acid, benzenesufonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylberizenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, decylbenzenesulfonic acid, dodecylbenzenesulfonic acid, butoxybeuzenesulfonic acid, dodecyloxybenzenesulfonic acid, 2-hydroxy-4-methoxybenzophenone-5-sulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesufonic acid, tributylnaphthalenesulforic acid, 1-naphthol-5-sulfonic acid, naphthalene-1-sulfonic acid, naphthalene-2-sulfonic acid, 1,8-dinitronaphthalene-3,6-disulfonic acid, and dimethyl-5-sulfoisophthalate; aromatic compounds containing hydroxyl groups such as 2,2',4,4'-tetrahydroxybenzophenone, 1,2,3-trihydroxybenzophenone and 2,2',4-trihydroxybenzophenone; halogenated Lewis acids such as hexafluorophosphoric acid and tetrafluoroboric acid; and perhalogenic acids such as perchloric acid and periodic acid. However, usable acids are not limited to these examples in the present invention. Of these acids, particularly preferred acids are butylnaphthalenesulfonic acid, dibutylnaphthalenesulfonic acid, hexafluorophosphoric acid, 2-hydroxy-4-methoxybenzophenone-5-sulfonic acid, and dodecylbenzenesulfonic acid.

Although the molecular weights of the diazo resins used in the present invention can be arbitrarily controlled depending on the molar ratio of monomers and conditions of condensation reactions, the molecular weights effective to attain the object of the present invention are from about 400 to about 100,000, and preferably from about 800 to about 8,000.

The water-insoluble, lipophilic polymers include copolymers which are prepared from monomers given in the following (1) to (15) and normally have molecular weights of 10,000 to 200,000.

(1) Acrylamides, methacrylamides, acrylic esters, and methacrylic esters, which contain an aromatic hydroxyl group, and hydroxystyrenes. For example, N-(4-hydroxyphenyl) acrylamide, N-(4-hydroxyphenyl)methacrylamide, o-, m- and p-hydroxystyrenes, and o-, m- and p-hydroxyphenyl acrylates and methacrylates.

(2) Acrylic esters and methacrylic esters containing an aliphatic hydroxyl group. For example, 2-hydroxyethyl acrylate, 2-hydroxyethyl methacrylate, and 4-hydroxybutyl methacrylate.

(3) Unsaturated carboxylic acids such as acrylic acid, methacrylic acid, maleic anhydride, and itaconic acid.

(4) (Substituted) alkyl acrylate such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, glycidyl acrylate, and N-dimethylaminoethyl acrylate.

(5) (Substituted) alkyl methacrylate such as methyl methacrylate, ethyl methacrylate, propyl methacrylate, butyl methacrylate, amyl methacrylate, cyclohexyl methacrylate, benzyl methacrylate, glycidyl methacrylate, and N-dimethylaminoethyl methacrylate.

(6) Acrylamides and methacrylamides such as acrylamide, methacrylamide, N-methylolacrylamide, N-methylolmethacrylamide, N-ethylacrylamide, N-hexylmethacrylamide, N-cyclohexyl-acrylamide, N-hydroxyethylacrylamide, N-phenylacrylamide, N-nitrophenylacrylamide, and N-ethyl-N-phenylacrylamide.

(7) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(8) Vinyl esters such as vinyl acetate, vinyl chloroacetae, vinyl butyrate, and vinyl benzoate.

(9) Styrenes such as styrene, α-methylstyrene and chloromethylstyrene.

(10) Vinyl ketones such as methyl vinyl ketone, ethyl vinyl ketone, propyl vinyl ketone, and phenyl vinyl ketone.

(11) Olefins such as ethylene, propylene, isobutylene, butadiene and isoprene.

(12) N-vinylpyrrolidone, N-vinylcarbazole, 4-vinylpyridine, acrylonitrile, methacrylonitrile, etc.

(13) Unsaturated imides such as maleimide, N-acryloylacrylamide, N-acetylmethacrylamide, N-propionylmethacrylamide, and N-(p-chlorobenzoyl) methacrylamide

(14) Unsaturated sulfonamides including methacrylamides such as N-(o-aminosulfonylphenyl)methacrylamide, N-(m-aminosulfonylphenyl)methacrylamide, N-(p-aminosulfonylphenyl)methacrylamide, N-(1-(3-aminosulfonyl)naphthyl)methacrylamide, and N-(2-aminosulfonylethyl)methacrylamide; acrylamides containing the same substituent groups as above; methacrylic esters such as o-aminosulfonylphenyl methacrylate, m-aminosulfonylphenyl methacrylate, p-aminosulfonylphenyl methacrylate, and 1-(3-aminosulfonylnaphthyl) methacrylate; and acrylic esters containing the same substituent groups as above.

(15) Unsaturated monomers containing a crosslinking group in a side chain such as N-(2-(methacryloyloxy)ethynyl)-2,3-dimethylmaleimide and vinyl cinnamate. Further, copolymers of the above monomers copolymerized with other monomers.

(16) Phenol resins described in U.S. Pat. No. 3,751,257 and polyvinyl acetal resins such as polyvinyl formal resins and polyvinyl butyral resins.

(17) Polyurethanes which are made alkali-soluble described in JP-B-54-19773, JP-A-57-94747, JP-A-60-182437, JP-A-62-58242, JP-A-62-123452, JP-A-62-123453, JP-A-63-113450, and JP-A-2-146042.

Polyvinyl butyral resins, polyurethane resins, polyamide resins, epoxy resins, novolak resins, and natural resins may be added to the above-mentioned copolymers as needed.

In the present invention, the photosensitive composition to be used for the support of the present invention can contain dyes to obtain visible images by exposure and visible images after development. Examples of such color-changing agents whose colors disappear or change to different colors include triphenylmethane dyes such as Victoria Pure Blue BOH (manufactured by Hodogaya Chemical Co., Ltd.), Oil Blue #603 (Orient Chemical Co., Ltd.), Patent Pure Blue (Sumitomo Mikuni Chemical Co., Ltd.), Crystal Violet, Brilliant Green, Ethyl Violet, Methyl Violet, Methyl Green, Erythrosine B, Basic Fuchsine, Malachite Green, Oil Red, m-Cresol Purple, Rhodamine B, Auramine, 4-p-diethylaminophenyl-iminonaphthoquinone, and cyano-p-diethylaminophenyl-acetanilide; diphenylmethane dyes; oxazine dyes; xanthene dyes; iminonaphthoquinone dyes; azomethine dyes; and anthraquinone dyes.

On the other hand, examples of colorless color-changing agents which generate colors include leuco dyes, and primary, secondary, and tertiary arylamine dyes represented by triphenylamine, diphenylamine, o-chloro-aniline, 1,2,3-triphenylguanidine, naphthylamine, diaminodiphenylmethane, p,p'-bis(dimethylamino) diphenylamine, 1,2-dianilinoethylene, p,p',p"-tris (dimethylamino)-triphenylmethane, p,p'-bis (dimethylamino)diphenylmethylimine, p,p',p" -triamino-o-methyltriphenylmethane, p,p'-bis(dimethylamino)diphenyl-4-anilinonaphthylmethane, and pp',p"-triaminotriphenylmethane. Of these dyes, favorable dyes are triphenylmethane dyes and diphenylmethane dyes, more favorable ones are triphenylmethane dyes, and most favorable one is Victoria Pure Blue BOH.

Various additives can further be incorporated into the photosensitive composition to be used for the support of the present invention. Examples of the additives employed preferably include alkyl ethers (for example, ethyl cellulose and methyl cellulose), fluorine type surfactants, and nonionic surfactants to improve coating properties (fluorine type surfactants are preferred); plasticizers to give flexibility and resistance to wear to film (for example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid. Of these plasticizers, tricresyl phosphate is particularly preferred); ink-receptivity enhancing agents to improve ink receptivity of image areas (for example, styrene/maleic anhydride copolymers half-esterified by alcohols as described in JP-A-55-527, novolak resins such as p-t-butylphenol/formaldehyde resins and p-hydroxystyrene in which 50% of the hydroxyl groups are esterified by aliphatic acid); stabilizers (for example, phosphoric acid, phosphorous acid, organic acids such as citric acid, oxalic acid, dipicolinic acid, benzenesulfonic acid, naphthalenesulfonic acid, sulfosalicylic acid, 4-methoxy-2-hydroxybenzophenone-5-sulfonic acid, and tartaric acid); development accelerators (for example, higher alcohols and acid anhydrides).

To apply the above-mentioned photosensitive composition to a support, the photosensitive diazo resins, the lipophilic polymers and other additives used as needed are dissolved in the respective appropriate amounts in a suitable solvent (methyl cellosolve, ethyl cellosolve, dimethoxyethane, diethylene glycol monomethyl ether, diethylene glycol dimethyl ether, 1-methoxy-2-propanol, methyl cellosolve acetate, acetone, methyl ethyl ketone, methanol, dimethylformamide, dimethylacetamide, cyclohexanone, dioxane, tetrahydrofuran, methyl lactate, ethyl lactate, ethylene dichloride, dimethyl sulfoxide, water, or mixtures thereof) to prepare a solution of the photosensitive compositions, applied to the support, and then dried.

Although the solvents can be singly used, it is more favorable to use a mixture of a high-boiling solvent such as methyl cellosolve, 1-methoxy-2-propanol and methyl lactate with a low-boiling solvent such as methanol and methyl ethyl ketone. The concentrations of solid contents in the solution of the photosensitive composition preferably range from 1 to 50% by weight. Then, the amount of the photosensitive composition to be applied to the support is generally from 0.2 to 10 $g/m^2$ (dry weight), and preferably from 0.5 to 3 $g/m^2$.

[III] Formation of Photosensitive Layer Containing Photodimerization Type Photosensitive Composition and Photopolymerizable Photosensitive Composition Photodimerization type photosensitive compositions contain a maleimido group, a cinnamyl group, a cinnamoyl group, a cinnamylidene group, a cinnamylideneacetyl group, or a chalcone group in the side chains or main chains of molecules. Polymers containing the maleimido group in the side chains include polymers described in JP-A-52-988 (corresponding to U.S. Pat. No. 4,079,041), German Patent 2,626,769, European Patents 21,019 and 3,552, and *Die Angewandte Makromolekulare Chemie,* 115, 163–181 (1983); and polymers described in JP-A-49-128991, JP-A-49-128992, JP-A-49-128993, JP-A-50-5376, JP-A-50-5377, JP-A-50-5379, JP-A-50-5378, JP-A-50-5380, JP-A-53-5298, JP-A-53-5299, JP-A-53-5300, JP-A-50-50107, JP-A-51-47940, JP-A-52-13907, JP-A-50-45076, JP-A-52-121700, JP-A-50-10884, JP-A-50-45087, and German Patents 2,349,948 and 2,617,276.

To make these polymers aqueous alkali-soluble or aqueous alkali-swelling, it is useful for the polymers to contain carboxylic acid, sulfonic acid, phosphoric acid, phosphonic acid, or their alkali metal salts or ammonium salts, or an acid group having a pKa of 6 to 12 which dissociates in aqueous alkali. It also is possible to copolymerize one to three kinds of monomers having these acid groups with a monomer having a maleimido group.

The acid value of maleimido polymers having the acid groups preferably ranges from 30 to 300. Of the polymers having such acid values, useful ones are copolymers of N-[2-(methacryloyloxy)ethyl]-2,3-dimethylmaleimide with methacrylic acid or acrylic acid as described in *Die Anaewandte Makromolekulare Chemie,* 128, 71–91 (1984). Further, ternary copolymers answering the purposes can be easily prepared by copolymerizing a third vinyl monomer on synthesis of the above-mentioned copolymers. For example, use of alkyl methacrylates or alkyl acrylates as the third vinyl monomer, in which glass transition points of their homopolymers are room temperature or less, makes it possible to give flexibility to the resulting copolymers.

Photocrosslinking polymers containing a cinnamyl group, a cinnamoyl group, a cinnamylidene group, a cinnamylideneacetyl group, or a chalcone group in the side chains or main chains of molecules include photosensitive polyesters described in U.S. Pat. No. 3,030,208, U.S. patent application Ser. Nos. 709,496 and 828,455.

Aqueous alkali-soluble photocrosslinking polymers made of the above-mentioned photocrosslinking polymers include the following compounds; photosensitive polymers as described in JP-A-60-191244 and photosensitive polymers as described in JP-A-62-175729, JP-A-62-175730, JP-A-63-25443, JP-A-63-218944, and JP-A-63-218945.

Sensitizers can be used for the photosensitive layers containing these polymers. Examples of such sensitizers include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofuranone compounds, pyrylium salts, and thiapyrylium salts. These photosensitive layers can contain as needed binders such as chlorinated polyethylene, chlorinated polypropylene, poly (alkyl acrylate), copolymers thereof with at least one kind of monomer such as alkyl acrylate, acrylonitrile, vinyl chloride, styrene, and butadiene, polyamides, methyl cellulose, polyvinyl formal, polyvinyl butyral, methacrylic acid copolymers, acrylic acid copolymers, and itaconic acid copolymers; and plasticizers such as dialkyl phthalates (for example, dibutyl phthalate and dihexyl phthalate), oligoethylene glycol alkyl esters, and phosphoric esters. To color the photosensitive layers, dyes or pigments, or pH indicators as print-out agents may be preferably added thereto.

Photopolymerizable photosensitive compositions include unsaturated carboxylic acids and their salts, unsaturated carboxylic esters with aliphatic polyhydric alcohols, and unsaturated carboxylic acid amides with aliphatic polyamine compounds.

Examples of photopolymerization initiators include vicpolyketoaldonyl compounds, α-carbonyl compounds, acyloin ethers, aromatic acyloin compounds substituted by hydrocarbon groups at the α-positions, polynuclear quinone compounds, combinations of triarylimidazole dimer and p-aminophenylketone, benzothiazole compounds, trihalomethyl-s-triazine compounds, acridine and phenazine compounds, and oxadiazole compounds. Aqueous alkali-soluble or aqueous alkali-swelling and film-formable polymers include copolymers of benzyl (meth)acrylate, (meth) acrylic acid and other addition-polymerizable vinyl monomers added as needed; copolymers of methacrylic acid and methyl methacrylate (or methacrylic acid esters); maleic anhydride copolymers which are half esterified by addition of pentaerythritol triacrylate; and acidic vinyl copolymers.

[IV] Electrophotographic Photosensitive Layer

A ZnO photosensitive layer disclosed, for example, by U.S. Pat. No. 3,001,872 can be employed. Further, photosensitive layers containing electrophotographic photosensitive materials described in JP-A-56-161550, JP-A-60-186847, and JP-A-61-238063 may also be employed.

The amount of the photosensitive layers provided on the supports ranges from about 0.1 to about 7 g/$m^2$, and preferably from 0.5 to 4 g/$m^2$ in dry weight.

In the method for producing the support for a lithographic printing plate of the present invention, interlayers can be provided as needed to enhance the adhesion between the photosensitive layers and the supports, to leave no photosensitive layers on the supports after development, or to prevent halation.

To enhance the adhesion, the interlayers generally comprise diazo resins, and, for example, phosphoric acid compounds, amino compounds or carboxylic acid compounds which are adsorbed in aluminum. The interlayers comprising substances having high solubility to leave no photosensitive layers on the supports after development contain polymers having good solubility or water-soluble polymers in general. To prevent the halation, the interlayers contain dyes or UV absorbing agents in general. Although the interlayers can have an arbitrary thickness, they are required to have a thickness sufficient to ensure an uniform bond formation reaction with the upper photosensitive layers. In general, the amount of the interlayers formed is preferably from about 1 to about 100 mg/$m^2$, and particularly preferably from about 5 to about 40 mg/$m^2$ in dry weight.

A matte layer constituted of projections isolated from one another can also be provided on the photosensitive layer. The matte layer is provided to improve vacuum contact between a negative image film and a photosensitive lithographic printing plate on contact exposure, which shortens evacuation time, and further, prevents halftone dots from plugging due to poor contact on exposure.

The methods for forming the matte layer include a method of heat fusing powdered solid described in JP-A-55-12974 and a method of spraying polymer-containing water and then drying described in JP-A-58-182636. Although any method can be used, it is desirable that the matte layer itself dissolve in an aqueous alkali developer substantially containing no organic solvent, or can be removed by the developer.

The photosensitive lithographic printing plate thus prepared is subjected to image exposure, and subsequently, to processing including development according to conventional-procedures, thus forming a resin image. For example, the photosensitive lithographic printing plate having the photosensitive layer of the above-mentioned [I], after the image exposure, is developed with an aqueous alkali solution as described in U.S. Pat. No. 4,259,434 to remove the layer of exposed areas, obtaining a lithographic printing plate; and in the photosensitive lithographic printing plate having the photosensitive layer of [II], after the image exposure, the photosensitive layer of unexposed-areas is removed by a developer as described in U.S. Pat. No. 4,186,006 to obtain a lithographic printing plate. To develop a positive type lithographic printing plate as described in JP-A-59-84241, JP-A-57-192952 and JP-A-62-24263, an aqueous alkali developer composition can also be employed.

The photosensitive lithographic printing plates obtained as described above are further corrected according to the method of the present invention.

In order to produce the lithographic printing plates of the present invention, correcting rolls having a roll diameter of 20 mm to 80 mm and a rubber hardness of 50 to 95 degrees are used. The term “rubber hardness” as used herein is a value measured with a rubber hardness meter according to the method specified in JIS K 6301-1975 and JIS K 7215-1986. The lithographic printing plates are corrected by this treatment so as to give an average curvature in a rolling direction of $1.5\times10^{-3}$ $mm^{-1}$ or less, a curvature distribution in a crosswise direction of $1.5\times10^{-3}$ $mm^{-1}$ or less, and a curvature in a direction perpendicular to said rolling direction of $1.0\times10^{-3}$ $mm^{-1}$ or less.

Further, an average surface roughness of 0.3 to 0.8 μm, and a difference between the average surface roughness in the rolling direction and that in the direction perpendicular to the rolling direction of 30% or less of said average surface roughness can provide lithographic printing plates excellent in printing durability.

The term “average surface roughness” as used herein is a value determined from the following equation (1), sampling a portion of the measurement length 1 in the direction of a center line from a roughness curve shown in JIS B 0601-1970, and indicating the roughness curve by “y=p(x)” with the center line of the sampled portion as the X-axis and with a longitudinal direction as the Y-axis.

$$R_a = \frac{1}{l}\int_0^l p(x) \quad (1)$$

That is, after application of the surface roughening treatment, the anodization treatment, coating and matte coating to the raw aluminum plates, the flatness is ensured with the above-mentioned correcting rolls, followed by cutting, accumulation and packaging.

In cutting, accumulation and packaging after correction, the flatness scarcely varies, and the state of correction influences the final flatness of the lithographic printing plates.

It is preferred that the above-mentioned correcting rolls have a diameter of 20 mm to 80 mm as described above. If the diameter is less than 20 mm, folds are developed on the aluminum surface by the influence of fluctuations in tension in handling, and the correcting force to aluminum is too high to obtain process stability.

On the other hand, if the diameter exceeds 80 mm, the correcting force is almost lost to exhibit no substantial effect as the correcting rolls. On the other hand, in order to prevent damage of the coated surfaces and the matte coats, rubber rolls, not metallic rolls, are dispensable for the correcting rolls. As to the hardness, less than 50 degrees is too soft, resulting in reduced correcting force, and exceeding 90 degrees gives damage to the matte layers and the coated layers, similarly to the metallic rolls.

A method for measuring the flatness is performed by the measurement of the radius of curvature using a strip as shown in FIG. 1.

First, an aluminum plate 1 is cut in a direction in which the flatness is desired to be determined, to a width of 20 mm and a pitch of 50 mm in a direction perpendicular to a longitudinal direction (a rolling direction) in the figure, as shown in (a) of FIG. 1, and the flatness is determined therefrom by the following measuring method to evaluate it by the curvature.

The curvature is determined from the following equation by measuring the maximum value h of curvature and the length 1 in curvature in a longitudinal direction of the aluminum plate 1 as shown in (b) of FIG. 1, and determining the radius of curvature therefrom.

$$\text{Curvature}=1/\eta=2h/(h^2+l^2/4)$$

EXAMPLES

The effects of the present invention can be more clarified by the following examples.

Examples 1 to 9 and Comparative Examples 1 to 7

A JIS 1050 material was mechanically sand grained at a revolution of 350 rpm with a device described in JP-B-50-40047, and the nerve of bristles and the grain size of an abrasive were changed to obtain a desired surface roughness. Then, washing with water was performed, and first etching was conducted. The concentration of sodium hydroxide was kept constant at 20%, the temperature was 50° C., and the treating time was adjusted so as to give a desired etching amount. Then, washing with water was performed, and smuts were removed with the following solution. First surface roughening was conducted in an aluminum concentration of 12 g/liter at a temperature of 40° C. by an electric waveform described in JP-A-3-79799 so that the quantity of anodic electricity reached a desired quantity of electricity. Then, cathodic electrolysis was conducted by the same electric waveform as in the first surface roughening so as to give a desired quantity of electricity.

Thereafter, second surface roughening was conducted with 10 g/liter nitric acid according to an electric waveform described in JP-A-3-79799 at an aluminum concentration of 5 g/liter and at a temperature of 45° C. so that the quantity of anodic electricity reached a desired quantity of electricity, and second etching was performed after washing with water. The concentration of sodium hydroxide and the temperature were the same as those in the first etching, and the treating time was adjusted so as to give the etching amount of 3 $g/m^2$.

Then, washing with water was performed, the desmut treatment was conducted with the following solution, and a film was formed with 120 g/liter sulfuric acid at a temperature of 45° C. so as to give an anodic oxide film amount of 3.0 $g/m^2$. Thereafter, the surface roughness was measured for a rolling direction of aluminum and a direction perpendicular thereto.

The base plate thus prepared was coated with the following composition so that the coated weight after drying reached 2.0 $g/m^2$ to form a photosensitive layer, followed by matte coating.

| Composition of Photosensitive Layer | |
|---|---|
| Ester Compound of Naphthoquinone-1,2-diazido-5-sulfonyl Chloride with Pyrogallol and Acetone Resin, Described in U.S. Pat. No. 3,635,709 | 0.75 g |
| Cresol Novolak Resin | 2.00 g |
| Oil Blue 603 (Orient Kagaku) | 0.04 g |
| Ethylene Dichloride | 16 g |
| 2-Methoxyethyl Acetate | 12 g |

Then, correction was carried out with correcting rolls, and the curvature was determined.

Results are shown in Tables 1 and 2.

For each sample in a printer, the scumming reduction was evaluated, and the aluminum folding, the accumulation accuracy and the suitability for an auto-processor were confirmed for the appearance.

TABLE 1

| | Surface Roughness | | | Correcting Roll | | Curvature ($\times 10^{-3}$ $mm^{-1}$) | | |
|---|---|---|---|---|---|---|---|---|
| Example No. | Rolling Direction (μm) | Perpendicular (μm) | Difference (%) | Roll Diameter (mm) | Rubber Hardness (degree) | Rolling Direction | Difference in Rolling Direction | Perpendicular Direction |
| Ex. 1 | 0.30 | 0.31 | 3.2% | 40 | 70 | 1.1 | 0.9 | 0.5 |
| Ex. 2 | 0.32 | 0.43 | 25.6% | 40 | 70 | 1.3 | 0.8 | 0.7 |
| Ex. 3 | 0.58 | 0.62 | 6.5% | 40 | 70 | 1.0 | 1.0 | 0.8 |
| Ex. 4 | 0.76 | 0.77 | 1.3% | 40 | 70 | 1.5 | 1.5 | 1.0 |
| Ex. 5 | 0.45 | 0.54 | 16.7% | 40 | 70 | 0.6 | 0.3 | 1.0 |
| Ex. 6 | 0.58 | 0.62 | 6.5% | 25 | 55 | 1.4 | 1.3 | 0.3 |
| Ex. 7 | 0.58 | 0.62 | 6.5% | 75 | 90 | 1.0 | 0.4 | 0.9 |
| Ex. 8 | 0.58 | 0.62 | 6.5% | 25 | 90 | 1.4 | 1.2 | 0.4 |
| Ex. 9 | 0.58 | 0.62 | 6.5% | 70 | 50 | 0.4 | 0.3 | 0.8 |
| Comp. Ex. 1 | 0.27 | 0.28 | 3.6% | 70 | 50 | 1.4 | 1.0 | 0.4 |
| Comp. Ex. 2 | 0.84 | 0.86 | 2.3% | 70 | 50 | 0.9 | 0.7 | 1.0 |
| Comp. Ex. 3 | 0.36 | 0.55 | 34.5% | 70 | 50 | 1.2 | 1.0 | 0.8 |
| Comp. Ex. 4 | 0.58 | 0.62 | 6.5% | 15 | 70 | 1.7 | 1.6 | 1.1 |
| Comp. Ex. 5 | 0.58 | 0.62 | 6.5% | 90 | 70 | 1.2 | 1.1 | 1.3 |
| Comp. Ex. 6 | 0.58 | 0.62 | 6.5% | 60 | 40 | 1.9 | 1.7 | 0.9 |
| Comp. Ex. 7 | 0.58 | 0.62 | 6.5% | 60 | 98 | 1.7 | 1.6 | 1.1 |

TABLE 2

| Example No. | Printing Durability | Scumming Reduction | Al Folding | Accumulation Accuracy | Suitability for Auto-Processor |
|---|---|---|---|---|---|
| Ex. 1 | 55,000 sheets | ◎○ | ○ | ○ | ○ |
| Ex. 2 | 60,000 sheets | ◎○ | ○ | ○ | ○ |
| Ex. 3 | 70,000 sheets | ○ | ○ | ○ | ○ |
| Ex. 4 | 80,000 sheets | ○Δ | ○ | ○ | ○ |
| Ex. 5 | 60,000 sheets | ○Δ | ○ | ○ | ○ |
| Ex. 6 | 70,000 sheets | ○ | ○Δ | ○Δ | ○Δ |
| Ex. 7 | 50,000 sheets | ○ | ○ | ○ | ○ |
| Ex. 8 | 60,000 sheets | ○ | ○ | ○ | ○ |
| Ex. 9 | 70,000 sheets | ○ | ○ | ○ | ○ |
| Comp. Ex. 1 | 30,000 sheets (NG) | ◎ | ○ | ○ | ○ |
| Comp. Ex. 2 | 50,000 sheets | x | ○ | ○ | ○ |
| Comp. Ex. 3 | 60,000 sheets | Δx | ○ | ○ | ○ |
| Comp. Ex. 4 | 45,000 sheets | ○ | x | x | x |
| Comp. Ex. 5 | 70,000 sheets | ○ | ○ | Δx | Δx |
| Comp. Ex. 6 | 60,000 sheets | ○ | ○ | x | x |
| Comp. Ex. 7 | 50,000 sheets | ○ | ○ | x | x |

Judging from the printing durability, the scumming reduction, the A1 folding, the accumulation accuracy and the suitability for an auto-processor overall, Tables 1 and 2 shows that Examples 1 to 9 are superior to Comparative Examples 1 to 7.

Example 10

An aluminum plate of JIS-1050 was treated with a 50% solution of sulfuric acid at 60° C., using a direct current electric source at a current density of 15 A/dm$^2$ at a quantity of electricity of 800 c/dm$^2$. At that time, the average surface roughness was 0.34 $\mu$m, and the maximum surface roughness was 3.4 $\mu$m. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/m$^2$. Then, washing with water was performed, and smuts were removed (desmutted) with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/dm$^2$. After washing with water, second etching was conducted. The concentration of sodium hydroxide was the same as with the first etching, the temperature was 40° C., and the treating time was adjusted so as to give an etching amount of 0.8 g/m$^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/m$^2$.

Example 11

An aluminum plate of JIS-1100 was treated with a 50% solution of sulfuric acid at 65° C., using a direct current electric source at a current density of 15 A/dm$^2$ at a quantity of electricity of 1500 c/dm$^2$. At that time, the average surface roughness was 0.29 $\mu$m, and the maximum surface roughness was 2.5 $\mu$m. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/m$^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/dm$^2$. After washing with water, second etching was conducted. The concentration of sodium hydroxide was the same as with the first etching, the temperature was 40° C., and the treating time was adjusted so as to give an etching amount of 0.8 g/m$^2$. Then, washing with water was-performed, the desmut treatment was conducted with a 25%–50° C. sulfuric acid solution, and a film was formed with 120 g/liter sulfuric acid at a temperature of 45° C. so as to give an anodic oxide film amount of 3.0 g/m$^2$.

Example 12

An aluminum plate of JIS-3005 was treated with a 60% solution of sulfuric acid at 55° C., using a direct current electric source at a current density of 15 A/dm$^2$ at a quantity of electricity of 1200 c/dm$^2$. At that time, the average surface roughness was 0.24 $\mu$m, and the maximum surface roughness was 2.2 $\mu$m. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/m$^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/dm$^2$. After washing with water, second etching was conducted. The concentration of sodium hydroxide was the same as with the first etching, the temperature was 40° C., and the treating time was adjusted so as to give an-etching amount of 0.8 g/m$^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/m$^2$.

Example 13

An aluminum plate of JIS-3005 was treated with a 50% solution of sulfuric acid at 70° C., using a direct current electric source at a current density of 15 A/dm$^2$ at a quantity of electricity of 1200 c/dm$^2$. At that time, the average surface roughness was 0.24 $\mu$m, and the maximum surface roughness was 2.2 $\mu$m. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 2 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 260 c/$dm^2$. After washing with water, second etching was conducted. The concentration of sodium hydroxide was the same as with the first etching, the temperature was 40° C., and the treating time was adjusted so as to give an etching amount of 0.1 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Example 14

An aluminum plate of JIS-1050 was polished by use of a nonwoven fabric roll with a diameter of 600 mm containing an alumina abrasive with a mean grain size of 1.5 μm, at a peripheral speed of 500 m/minute at a vibration frequency of 200 cycles/minute. At that time, the average surface roughness was 0.33 μm, and the maximum surface roughness was 3.2 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount.of 3.0 g/$m^2$.

Example 15

An aluminum plate of JIS-1100 was polished by use of a nonwoven fabric roll with a diameter of 600 mm containing an alumina abrasive with a mean grain size of 5.5 μm, at a peripheral speed of 500 m/minute at a vibration frequency of 400 cycles/minute. At that time, the average surface roughness was 0.25 μm, and the maximum surface roughness was 2.1 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 450C so as to give an anodic oxide film amount of 3.0 g/$m^2$.

Example 16

An aluminum plate of JIS-3005 was polished by use of a nonwoven fabric roll with a diameter of 500 mm containing an alumina abrasive with a mean grain size of 7.5 μm, at a peripheral speed of 800 m/minute at a vibration frequency of 500 cycles/minute. At that time, the average surface roughness was 0.21 μm, and the maximum surface roughness was 1.8 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Example 17

An aluminum plate of JIS-3005 was polished by use of a nonwoven fabric roll with a diameter of 500 nm containing an alumina abrasive with a mean grain size of 22 μm, at a peripheral speed of 500 m/minute at a vibration frequency of 200 cycles/minute. At that time, the average surface roughness was 0.24 μm, and the maximum surface roughness was 2.2 μm. The concentration of sodium hydroxide was kept constant at 25%, the temperature was 55° C., and the treating time was adjusted so as to give an etching amount of 2 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 260 c/$dm^2$. After washing with water, second etching was conducted. The concentration of sodium hydroxide was the same as with the first etching, the temperature was 40° C., and the treating time was adjusted so as to give an etching amount of 0.1 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Example 18

An aluminum plate of JIS-1100 was polished by use of a nonwoven fabric roll with a diameter of 600 mm containing an alumina abrasive with a mean grain size of 2 μm at a peripheral speed of 1000 m/minute at a vibration frequency of 800 cycles/minute. At that time, the average surface roughness was 0.16 μm, and the maximum surface roughness was 1.2 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Comparative Example 8

An aluminum plate of JIS-1050 having an average surface roughness of 0.37 μm and a maximum surface roughness of 3.8 μm was used as it is. Then, mechanical sand graining was conducted to this aluminum plate at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed (desmutted) with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount.of 3.0 g/$m^2$.

Comparative Example 9

An aluminum plate of JIS-1100 was treated with a 50% solution of sulfuric acid at 65° C., using a direct current electric source at a current density of 15 A/$dm^2$ at a quantity of electricity of 10,000 c/$dm^2$. At that time, the average surface roughness was 0.13 μm, and the maximum surface roughness was 0.9 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 260 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Comparative Example 10

An aluminum plate of JIS-3005 was polished by use of a nonwoven fabric roll with a diameter of 500 mm containing an alumina abrasive with a mean grain size of 28 μm, at a peripheral speed of 500 m/minute at a vibration frequency of 10 cycles/minute. At that time, the average surface roughness was 0.4 μm, and the maximum surface roughness was 4.2 μm. Then, mechanical sand graining was conducted at a revolution of 350 rpm with a device described in JP-B-50-40047. The concentration of sodium hydroxide was kept constant at 25%, the temperature was 55° C., and the treating time was adjusted so as to give an etching amount of 7 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 250 c/$dm^2$. After washing with water, second etching was conducted. The concentration of sodium hydroxide was the same as with the first etching, the temperature was 40° C., and the treating time was adjusted so as to give an etching amount of 0.8 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

Comparative Example 11

An aluminum plate of JIS-3005 was polished by use of a nonwoven fabric roll with a diameter of 500 mm containing an alumina abrasive with a mean grain size of 0.8 μm, at a peripheral speed of 500 m/minute at a vibration frequency of 1000 cycles/minute. At that time, the average surface roughness was 0.09 μm, and the maximum surface roughness was 0.7 μm. The concentration of sodium hydroxide was kept constant at 25%, the temperature was 55° C., and the treating time was adjusted so as to give an etching amount of 2 g/$m^2$. Then, washing with water was performed, and smuts were removed with a 25%–50° C. sulfuric acid solution. Thereafter, surface roughening was conducted with 12 g/liter nitric acid according to an electric source waveform described in JP-A-3-79799 at an aluminum concentration of 4 g/liter and at a temperature of 40° C. so that the quantity of anodic electricity reached 260 c/$dm^2$. After washing with water, second etching was conducted. The concentration of sodium hydroxide was the same as with the first etching, the temperature was 40° C., and the treating time was adjusted so as to give an etching amount of 0.1 g/$m^2$. Then, washing with water was performed, the desmut treatment was conducted with a 25%–50° C. sulfuric acid solution, and a film was formed with 120 g/liter sulfuric acid at a temperature of 45° C. so as to give an anodic oxide film amount of 3.0 g/$m^2$.

As to the aluminum supports obtained in Examples 10 to 18 and Comparative Examples 8 to 11 described above, a study of continuous production was conducted in a pilot plant. As a result, the aluminum supports obtained in Comparative Examples 9 and 11 entailed high cost for the preliminary graining, and slippage occurred because of their very small surface roughness to cause a failure in stable handling of the aluminum webs which is necessary for continuous production. Except for Comparative Examples 9 and 11, therefore, each of the aluminum supports obtained in Examples 10 to 18 and Comparative Examples 8 and 10 was coated with the following composition so that the coated weight after drying reached 2.0 $g/m^2$ to form a photosensitive layer, followed by matte coating.

| Composition of Photosensitive Layer | |
|---|---|
| Ester Compound of Naphthoquinone-1,2-diazido-5-sulfonyl Chloride with Pyrogallol and Acetone Resin, Described in U.S. Pat. No. 3,635,709, Example 1 | 0.75 g |
| Cresol Novolak Resin | 2.00 g |
| Oil Blue 603 (Orient Kagaku) | 0.04 g |
| Ethylene Dichloride | 16 g |
| 2-Methoxyethyl Acetate | 12 g |

Prints were made using each of the resulting samples. As a result, when the aluminum supports obtained in Examples of the present invention were used, good prints were obtained even at 70,000 prints for all supports. In contrast, when the aluminum supports obtained in Comparative Examples 8 and 10 were used, streak-like unevenness was developed on coated surfaces, resulting in poor prints at 20,000 prints.

As described above, according to the present invention, the printing performance of the lithographic printing plates is further improved, the efficiency of exposure and development procedures can be more increased, the flatness of the lithographic printing plates is improved, and the productivity of the lithographic printing plates can be improved. Furthermore, the aluminum supports for lithographic printing plates having uniform quality can be obtained at minimum cost, and the use of the supports can provide the lithographic printing plates excellent in printing durability.

What is claimed is:

1. A method for producing a support for a lithographic printing plate comprising roughening a surface of an aluminum web having a center line average surface roughness of 0.15 to 0.35 μm and a maximum surface roughness of 1 to 3.5 μm by at least one of mechanical surface roughening, chemical etching and electrochemical surface roughening, and then applying anodization thereto.

2. The method according to claim 1, wherein the characteristics of said aluminum web are given by preliminary graining.

3. The method according to claim 2, wherein said preliminary graining is conducted by direct current electrolytic graining.

4. The method according to claim 2, wherein said preliminary graining is conducted by use of a roll formed of nonwoven fabric containing an abrasive with a mean grain size of 1 to 25 μm.

* * * * *